(12) United States Patent
Morgan (10) Patent No.: US 8,497,433 B2
(45) Date of Patent: Jul. 30, 2013

(54) CIRCUIT BOARD HAVING IMPROVED GROUND VIAS

(75) Inventor: Chad William Morgan, Woolwich Township, NJ (US)

(73) Assignee: Tyco Electronics Corporation, Berwyn, PA (US)

( * ) Notice: Subject to any disclaimer, the term of this patent is extended or adjusted under 35 U.S.C. 154(b) by 586 days.

(21) Appl. No.: 12/729,920

(22) Filed: Mar. 23, 2010

(65) Prior Publication Data

US 2011/0232955 A1 Sep. 29, 2011

(51) Int. Cl.
*H05K 1/11* (2006.01)
(52) U.S. Cl.
USPC ............................................. 174/262; 439/75
(58) Field of Classification Search
USPC .............. 174/262–266; 361/792–795; 439/75
See application file for complete search history.

(56) References Cited

U.S. PATENT DOCUMENTS

| 5,543,586 A | 8/1996 | Crane, Jr. et al. |
| 2006/0243481 A1* | 11/2006 | Bachar et al. ................. 174/262 |
| 2007/0169961 A1 | 7/2007 | Kwong et al. |
| 2008/0093112 A1* | 4/2008 | Kushta .......................... 174/260 |
| 2008/0207015 A1 | 8/2008 | Sueyoshi |

* cited by examiner

*Primary Examiner* — Jeremy Norris (57) ABSTRACT

A circuit board includes a substrate having an upper surface and a lower surface. The circuit board has signal vias extending at least partially through the substrate along signal via axes being configured to receive signal terminals and ground vias extending at least partially through the substrate along ground via axes being configured to receive ground terminals. The ground vias are arranged in a predetermined pattern around the signal vias to create a ground ring surrounding the corresponding signal via, wherein the ground vias are at least partially filled with a conductive material to create a ground column. Each ground column extends from a column top to a column bottom. A first subset of the ground columns extending to a first depth and a second subset of the ground columns extending to a second depth greater than the first depth.

19 Claims, 5 Drawing Sheets

CIRCUIT BOARD HAVING IMPROVED GROUND VIAS

BACKGROUND OF THE INVENTION

The subject matter described and/or illustrated herein relates generally to electrical connector systems and, more particularly, to electrical connectors that are mounted on circuit boards.

To meet digital multi-media demands, higher data throughput is often desired for current digital communications equipment. Electrical connectors that interconnect circuit boards must therefore handle ever increasing signal speeds at ever increasing signal densities. One application environment that uses such electrical connectors is in high speed, differential electrical connectors, such as those common in the telecommunications or computing environments. In a traditional approach, two circuit boards are interconnected with one another in a backplane and a daughter board configuration. However, at the footprints of the circuit boards where the electrical connectors connect thereto it may be difficult to improve density while maintaining electrical performance and/or reasonable manufacturing cost. For example, in known circuit boards, signal vias within the circuit boards are plated, creating plated through holes (PTHs) that are electrically connected to corresponding traces in the circuit board. Contacts extending from the electrical connectors are connected to the PTHs, and thus the traces, using eye-of-the-needle contacts. Similarly, ground vias are routed through the circuit boards, which are also plated, creating PTHs, which connect to ground contacts of the electrical connectors.

Positioning the ground PTHs around the signal PTHs has an effect of reducing cross-talk, however, the interactions between the ground and signal PTHs can still create electrical problems, such as by lowering impedance. One method of improving such footprints is to counterbore a portion(s) of the signal PTHs to remove the plating to an area just in the vicinity of the corresponding trace in the circuit board. However, the same problems still remains in the short length of the non-bored PTHs that remain for interfacing the contacts with the traces. This region, though short, still interacts with the neighboring ground PTHs to lower impedance, which becomes increasingly problematic at higher transmission speeds.

To achieve higher system densities and speed, further improvement of circuit board footprints and connections to the circuit boards must be made over known approaches. There is a need for an electrical connector that enables improvement of the density and/or electrical performance of circuit board footprints to achieve higher system densities and/or higher system speeds.

BRIEF DESCRIPTION OF THE INVENTION

In one embodiment, a circuit board is provided including a substrate having an upper surface and a lower surface. The circuit board has signal vias extending at least partially through the substrate along signal via axes being configured to receive signal terminals and ground vias extending at least partially through the substrate along ground via axes being configured to receive ground terminals. The ground vias are arranged in a predetermined pattern around the signal vias to create a ground ring surrounding the corresponding signal via, wherein the ground vias are at least partially filled with a conductive material to create a ground column. Each ground column extends from a column top to a column bottom. A first subset of the ground columns extending to a first depth and a second subset of the ground columns extending to a second depth greater than the first depth.

In another embodiment, a circuit board is provided that includes a substrate having an upper surface and a lower surface with signal traces routed through the circuit board. Signal vias extend at least partially through the circuit board along via axes, with electrical conductors on inner surfaces thereof being electrically connected to corresponding signal traces. The signal vias are configured to receive signal terminals such that the signal terminals engage the electrical conductors. Ground vias extend at least partially through the circuit board along via axes. The ground vias are plated with a plating material and arranged in a predetermined pattern around the signal vias to create a ground ring surrounding the corresponding signal vias. At least some of the ground vias in the ground ring are counterbored from the lower surface of the circuit board to remove at least a portion of the plating material to a depth above the electrical conductor of the corresponding signal via.

In a further embodiment, an electrical connector assembly is provided including an electrical connector having a mounting face and ground terminals extending from the mounting face. The electrical connector has variable depth signal terminals configured to extend different lengths from the mounting face. The electrical connector assembly also includes a multi-layer circuit board having an upper surface and a lower surface, with signal traces routed through the circuit board and ground layers positioned within the circuit board. A first signal via and a second signal via extend at least partially through the circuit board along parallel via axes. The first and second signal vias have electrical conductors on inner surfaces thereof being electrically connected to corresponding signal traces. The signal vias are configured to receive signal terminals such that the signal terminals engage the electrical conductors. The signal terminals are configured to extend different depths into the corresponding signal vias based on the lengths of the signal terminals. Ground vias extend at least partially through the circuit board along parallel via axes. The ground vias pass through at least one of the ground layers and are plated with a plating material being electrically connected to at least one of the ground layers. The ground vias are arranged in a predetermined pattern around the first signal via to create a ground ring surrounding the first signal via. The ground vias are at least partially filled with a conductive material to create a ground column, and each ground column extends from a column top to a column bottom. A first subset of the ground columns extends to a first depth being above the electrical conductor of the corresponding signal via, and a second subset of the ground columns extends to a second depth greater than the first depth.

DETAILED DESCRIPTION OF THE INVENTION

Figure 1:
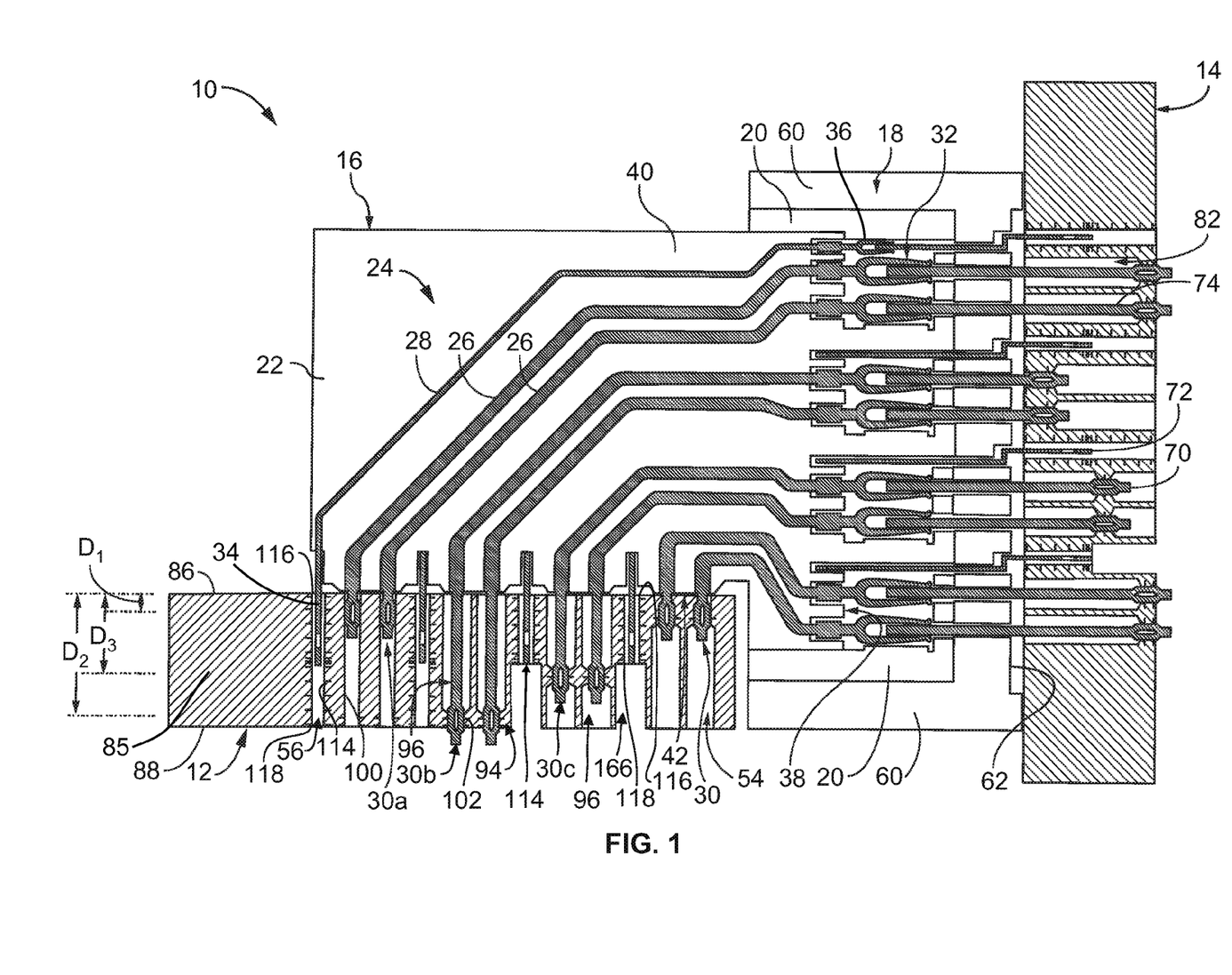
FIG. 1 is a cross-sectional view of an exemplary embodiment of an electrical connector assembly illustrating electrical connectors mounted to circuit boards.

FIG. 1 is a cross-sectional view of an exemplary embodiment of an electrical connector assembly 10. The connector assembly 10 includes a pair of circuit boards 12 and 14, a receptacle connector 16, and a header connector 18. The receptacle connector 16 is mounted on the circuit board 12, and the header connector 18 is mounted on the circuit board 14. The receptacle connector 16 and the header connector 18 are connected together to electrically connect the circuit boards 12 and 14. In the exemplary embodiment of FIG. 1, the receptacle connector 16 and the header connector 18 are oriented such that the connectors 16 and 18 form an approximate right-angle connection between the circuit boards 12 and 14. Alternatively, the receptacle connector 16 and the header connector 18 may be oriented such that the circuit boards 12 and 14 are oriented at any other angle relative to each other, such as, but not limited to, approximately parallel. The subject matter herein may be described with reference to either the circuit board 12 or the circuit board 14, however it is realized that features or elements described relative to one of the circuit boards 12 or 14 may apply equally to the other circuit board 12 or 14. Similarly, the subject matter herein may be described with reference to either the receptacle connector 16 or the header connector 18, however it is realized that features or elements described relative to one of the receptacle connector 16 or the header connector 18 may apply equally to the other of the receptacle connector 16 or the header connector 18.

The receptacle connector 16 includes a dielectric housing 20 that, in the illustrated embodiment, holds a plurality of parallel contact modules 22 (one of which is illustrated in FIG. 1). The contact module 22 includes a contact lead frame 24 that includes a plurality of signal terminals 26 and a plurality of ground terminals 28. Each signal terminal 26 includes a mounting contact 30 at one end portion of the signal terminal 26 and a mating contact 32 at an opposite end portion of the signal terminal 26. Similarly, each ground terminal 28 includes a mounting contact 34 at one end portion of the ground terminal 28 and a mating contact 36 at an opposite end portion of the ground terminal 28. The mating contacts 32 and 36 extend outward from, and along, a mating face 38 of the contact module 22. The signal terminals 26 are optionally arranged in differential pairs.

Each contact module 22 includes a dielectric contact module housing 40 that holds the corresponding lead frame 24. Each contact module housing 40 includes the mating face 38 and a mounting face 42. In the illustrated embodiment, the mating face 38 is approximately perpendicular to the mounting face 42. However, the mating face 38 and mounting face 42 may be oriented at any other angle relative to each other, such as, but not limited to, approximately parallel. The mating face 38 of each contact module is received in the housing 20 and is configured to mate with corresponding mating contacts of the header connector 18.

The mounting face 42 of each of the contact modules 22 is configured for mounting on a circuit board, such as, but not limited to, the circuit board 12. The mounting contacts 30 and 34 extend outward from, and along, the mounting face 42 of the contact modules 22 for mechanical and electrical connection to the circuit board 12. Specifically, each of the mounting contacts 30 and 34 is configured to be received within a corresponding signal via 54 and a corresponding ground via 56, respectively.

In an exemplary embodiment, the signal terminals 26 constitute variable depth connection terminals, where some of the mounting contacts 30 extend different lengths from the mounting face 42 than others of the mounting contacts 30 (whether the others are on the same contact module 22 or a different contact module 22) to different mating depths. For example, a differential pair 30a of the mounting contacts 30 extends to a mating depth $D_1$ from the mounting face 42, a differential pair 30b of the mounting contacts 30 extends to a mating depth $D_2$ from the mounting face 42, and a differential pair 30c of the mounting contacts 30 extends to a mating depth $D_3$ from the mounting face 42. The depths $D_1$-$D_3$ are each different. Any of the mounting contacts 30 of the receptacle connector 16 may have a different length, and thus a different mating depth, from the corresponding mounting face 42 than any other mounting contact 30 of the receptacle connector 16. The pattern of the lengths of the mounting contacts 30 shown herein is meant as exemplary only.

The header connector 18 includes a dielectric housing 60 that receives the receptacle connector 16 and a mounting face 62 for mounting the header connector 18 to a circuit board, such as, but not limited to, the circuit board 14. The housing 60 holds a plurality of signal terminals 70 and a plurality of ground terminals 72. The signal terminals 70 are optionally arranged in differential pairs, as the signal terminals 70 are shown in the illustrated embodiment.

Each signal terminal 70 includes a mounting contact 74 at one end portion of the signal terminal 70. Each of the mounting contacts 74 is configured to be received within a corresponding via 82 within the circuit board 14. Similar to the mounting contacts 30 of the receptacle connector 16, some of the mounting contacts 74 of the signal terminals 70 extend different lengths from the mounting face 62 of the header connector 18 than others of the mounting contacts 74.

The circuit board 12 includes a substrate 85 having a pair of opposite upper and lower surfaces 86 and 88. The mounting face 42 of each of the contact modules 22 is configured to be mounted along the upper surface 86 such that the receptacle connector 16 is mounted on the upper surface 86 of the circuit board 12. The circuit board 12 includes the plurality of signal and ground vias 54 and 56 that receive the mounting contacts 30 and 34, respectively, of the respective signal and ground terminals 26 and 28. The circuit board 14 may be formed in a similar manner as the circuit board 12.

The signal vias 54 each include a smaller diameter portion 94 and one or more larger diameter portions 96. The smaller diameter portions 94 each include an electrical conductor 98 on a surface 100 defining the smaller diameter portion 94 of the signal via 54. In an exemplary embodiment, the electrical conductor 98 is defined by plating material deposited on the surface 100 during a plating process. Each electrical conductor 98 defines an electrical contact portion for electrical connection with a corresponding one of the mounting contacts 30 of the signal terminals 26. The electrical conductor 98 of each signal via 54 is electrically connected to a signal trace (not shown) of the circuit board 12 through a mounting pad 102 of the signal trace. For example, the mounting pad 102 is embedded in or on one of the layers of the circuit board 12, and the signal via 54 extends through the mounting pad 102. The electrical conductor 98 of the smaller diameter portion 94 of the via 54 is electrically connected to the mounting pad 102 by a direct contact with the mounting pad 102.

The electrical conductors 98 of some of the signal vias 54 are located at respective different depths within the corresponding vias 54 relative to the surface 86 of the circuit board 12. Each electrical conductor 98 may be formed by any suitable method, process, means, and/or the like, such as, but not limited to, plating and/or the like. Each of the signal vias 54 may be formed using any suitable method, process, means, and/or the like. For example, each of the signal vias 54 may be formed by creating an opening within the circuit board 12 to define the surface 100 of the smaller diameter portion 94, forming the electrical conductor 98 on the surface 100, and thereafter boring through the circuit board 12 to define the larger diameter portion(s) 96. The boring operation will remove the surface 100 and the electrical conductor 98 from the entirety of the signal via 54 except for the smaller diameter portion 94.

When the receptacle connector 16 is mounted on the circuit board 12, the mounting contacts 30 are each received within the corresponding signal via 54, such that the mounting contacts 30 are electrically connected to the respective electrical conductor 98. Some of the mounting contacts 30 of the signal terminals 26 extend different depths, relative to the circuit board surface 86, into the corresponding via 54 than others of the mounting contacts 30 (whether the others are on the same contact module 22 or a different contact module 22). Although the mounting contacts 30 are shown herein as press-fit contacts, the mounting contacts 30 may each be any suitable type of electrical contact that enables the mounting contacts 30 to function as described herein.

The ground vias 56 are provided between certain signal vias 54. For example, pairs of signal vias 54, which receive signal terminals 26 of a differential pair, are flanked by ground vias 56 on one or both sides of the signal vias 54. The mounting contacts 34 of the ground terminals 28 are received in the corresponding ground vias 56. The ground vias 56 each include ground columns 114 extending at least partially between the upper and lower surfaces 86, 88. The ground columns 114 may be formed by lining the ground vias 56 with a conductive material, such as a plating material during a plating process. The plating of the plated vias define the ground columns 114. Alternatively, the ground columns 114 may be formed by filling, entirely or partially, the ground vias 56 with a conductive material, such as a conductive epoxy.

Each ground column 114 extends from a column top 116 to a column bottom 118. The column top 116 may be provided at the upper surface 86 of the circuit board 12, or alternatively, may be recessed below or elevated above the upper surface 86. The column bottom 118 may be provided at the lower surface 88 of the circuit board 12, or alternatively, may extend below or be elevated above the lower surface 88. In an exemplary embodiment, at least some of the ground vias 56 have column bottoms 118 that are elevated above the lower surface 88 of the circuit board 12 to a depth above the nearest electrical conductor 98 of the neighboring signal via 54. By positioning the ground column 114 above the electrical conductor 98, the impedance of the signal terminals 26 may be increased because the ground column 114 is removed from the vicinity of the electrical conductor 98.

One method of elevating the column bottoms 118 is to counterbore the ground via 56 to remove at least a portion of the ground column 114 to the desired depth from the upper surface 86. Alternatively, rather than counterboring material away, the ground column 114 may be formed just to the desired level, such as by plating or filling the ground via 56 to the desired depth from the upper surface 86. Optionally, the ground via 56 may extend through less than all of the layers of the circuit board to the desired depth, as opposed to completely through all of the layers of the circuit board 12. Optionally, the ground columns 114 may extend to a depth sufficient to allow the ground terminals 28 to make a grounding electrical connection to at least one of the ground layers of the circuit board 12, such as to a depth approximately equal to a length of the mounting contact 34, such that the column bottom 118 is generally aligned with an end of the mounting contact 34.

Figure 2:
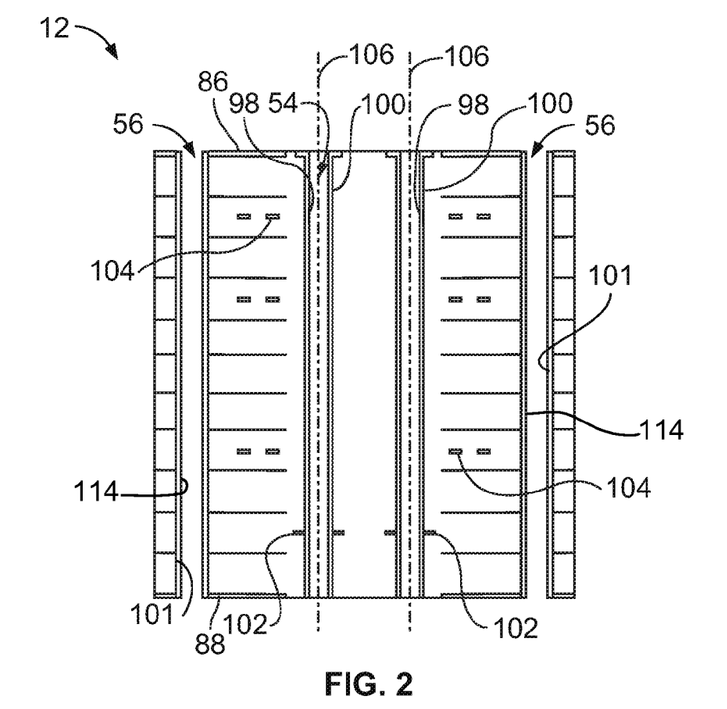
FIG. 2 is a partial cut-away view of one of the circuit boards during one stage of manufacture.

FIG. 2 is a partial cut-away view of a portion the circuit board 12 during one stage of manufacture illustrating a pair of the signal vias 54 flanked by ground vias 56. The signal and ground vias 54, 56 extend through the layers of the circuit board 12 between the upper and lower surfaces 86, 88. The thickness of the circuit board 12 is determined by the number of layers, and the number of layers may be determined, at least in part, by the number of components being connected to the circuit board 12. For example, a backplane circuit board may be substantially thicker than a daughtercard circuit board because many more electrical components are connected to the backplane circuit board as compared to the daughtercard circuit board, thus more layers are required to route the traces through the board.

In an exemplary embodiment, the signal vias 54 and the ground vias 56 are formed by boring through the circuit board 12 at predetermined locations. The signal vias 54 are bored in locations that pass though corresponding mounting pads 102 in, or on, one of the layers. The mounting pads 102 are connected to corresponding signal traces (not shown) routed through the circuit board 12. The mounting pads 102 define the connection point between the receptacle connector 16 (shown in FIG. 1) and the circuit board 12. Boring through the circuit board 12 forms the surface 100 of the signal via 54 and a similar surface 101 of the ground via 56. The surfaces 100, 101 are cylindrical and have a certain diameter. The thickness of the circuit board 12 may affect the diameters of the signal and ground vias 54, 56. For example, the diameters need to maintain a certain aspect ratio with the thickness of the circuit board 12 for adequate plating of the signal and ground vias 54, 56. If the diameters are too small, as compared to the thickness of the circuit board 12, then the surfaces 100, 101 cannot be properly plated.

Once the signal vias 54 and the ground vias 56 are bored, the surfaces 100, 101 are plated, thus forming the electrical conductor 98 and the ground column 114, respectively. The plating process deposits a metal surface on the surface 100, which engages the mounting pads 102, thus creating an electrical connection between the mounting pads 102 and the electrical conductors 98. When the mounting contacts 30 (shown in FIG. 1) engage the electrical conductors 98, an electrical path is created between the mounting contacts 30 and the mounting pads 102. Similarly, the plating process deposits a metal surface on the surface 101 to form the ground columns 114, which engages, and are electrically connected to, the ground layers such that the ground columns 114 and the ground layers are at the same electrical potential.

Having the electrical conductors 98 in proximity to the ground columns 114 and/or other traces 104 routed through the various layers of the circuit board 12 has a negative impact on the electrical performance of the system. For example, the impedance of the signals may be lowered due to the proximity of the electrical conductors 98 to the ground columns 114. Additionally, signal degradation due to cross-talk between the electrical conductors 98 and the traces 104 may result. The effects of the signal degradation may be impacted by the characteristics of the signals being transmitted by the electrical conductors 98 and/or the traces 104, such as, but not limited to, the signal transmission speed. In an exemplary embodiment, at least a portion of each electrical conductor 98 is removed during a counterboring process to reduce the length of the electrical conductor 98 along a via axis 106 thereof. This reduction in length has the effect of reducing cross-talk with the neighboring traces 104. Furthermore, the impedance is not lowered as much when portions of the electrical conductors 98 are removed as there is less interaction between the electrical conductors 98 and the ground columns 114.

Figure 3:
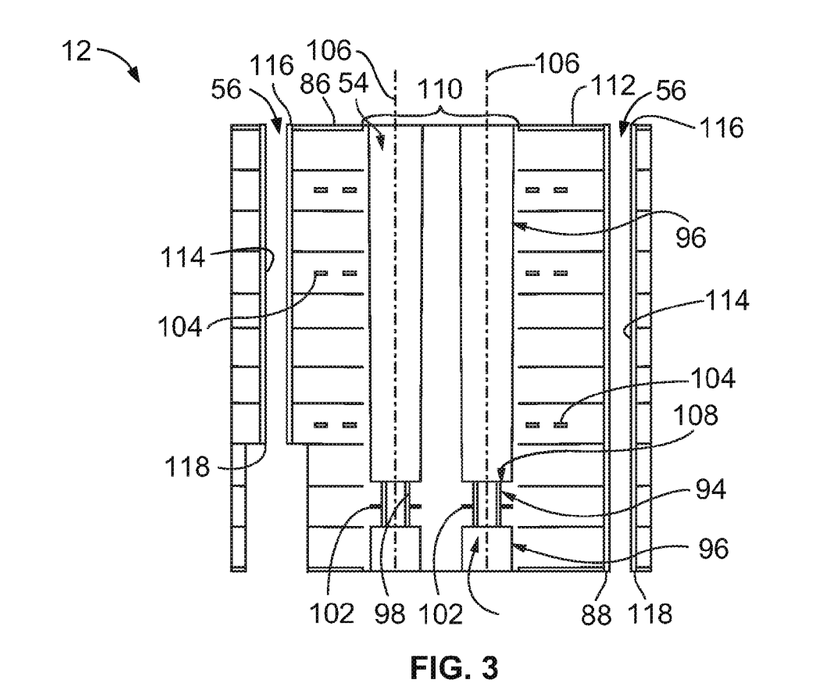
FIG. 3 is a partial cut-away view of the circuit board shown in FIG. 2 during another stage of manufacture.

FIG. 3 is a partial cut-away view of the circuit board 12 during another stage of manufacture after the counterboring operation. In the illustrated embodiment, the signal vias 54 are counterbored from the upper surface 86 and from the lower surface 88. The signal vias 54 are counterbored to the vicinity of the mounting pads 102, leaving a relatively short electrical conductor 98. The counterboring reduces the cross-talk with neighboring traces 104. The counterboring reduces the interaction with neighboring ground columns 114. Counterboring from the upper surface 86 and the lower surface 88 may not be possible for each signal via 54. For example, vias 54 having electrical conductors 98 at or near one of the upper layers may not have any counterboring from the upper surface 86. Similarly, vias 54 having electrical conductors 98 at or near one of the bottom layers may not have any counterboring from the lower surface 88.

In an exemplary embodiment, at least one of the neighboring ground vias 56, and corresponding ground columns 114, are counterbored from the lower surface 88. The ground vias 56, and corresponding ground columns 114, are counterbored to a depth above the electrical conductor 98. The counterboring of the ground column 114 to a depth above the electrical conductor 98 affects the impedance of the signal terminals 26 because the ground column 114 is removed from the vicinity of the electrical conductor 98 in a direction outward from the signal propagation path.

The counterboring of the signal vias 54 defines the larger diameter portions 96 for each signal via 54. The portion of the signal via 54 not counterbored defines the smaller diameter portion 94. A shoulder 108 is created at the interface between the upper larger diameter portion 96 and the smaller diameter portion 94. Optionally, the shoulder 108 may be tapered toward the mounting pad 102 along the via axis 106. In an exemplary embodiment, the diameter of the smaller diameter portion 94 is approximately half the diameter of the larger diameter portion 96. Having a large diameter for the larger diameter portions 96 introduces air in the signal via 54 along the via axis 106 around the signal terminal 26 (shown in FIG. 4). The air affects interpair and intrapair coupling as described in further detail below, such as by lowering cross-talk with neighboring traces 104 and/or raising impedance of the signal terminals 26. The diameter of the larger diameter portion 96 may be restricted by other components of the circuit board 12, such as the proximity of neighboring traces 104 to the signal via 54 and/or the spacing between the signal vias 54 themselves. The diameter of the larger diameter portion 96 may be restricted by a size of one or more opening(s) 110, also known as an antipad, in one or more ground layer(s) 112. The opening 110 and the ground layer 112 are also illustrated in FIG. 5. The ground layer 112 is designed to be a certain distance from the mounting contacts 30 (shown in FIG. 1) to control impedance.

Figure 4:
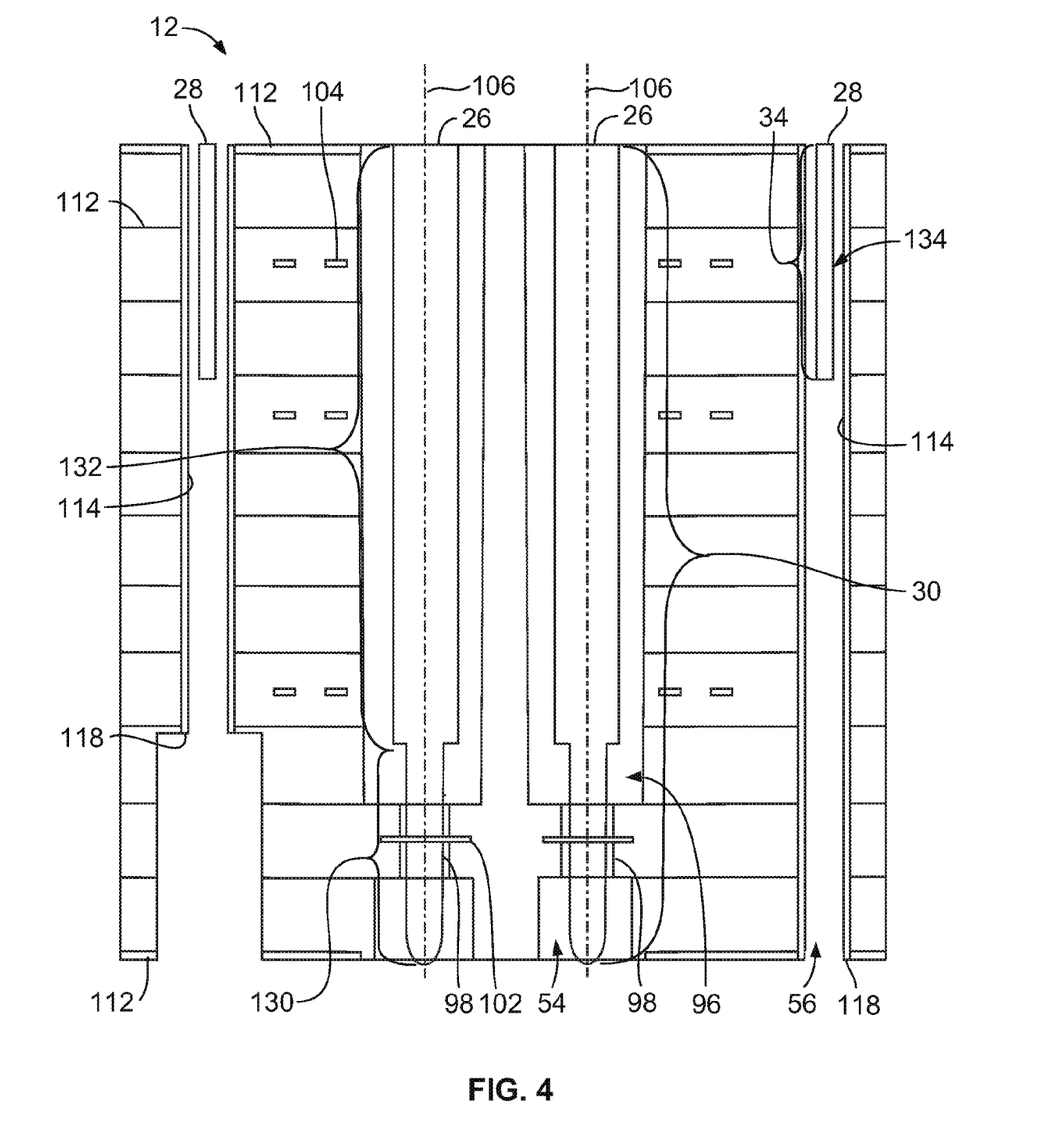
FIG. 4 is a partial cut-away view of the circuit board illustrating signal terminals and ground terminals mounted to the circuit board.
Figure 5:
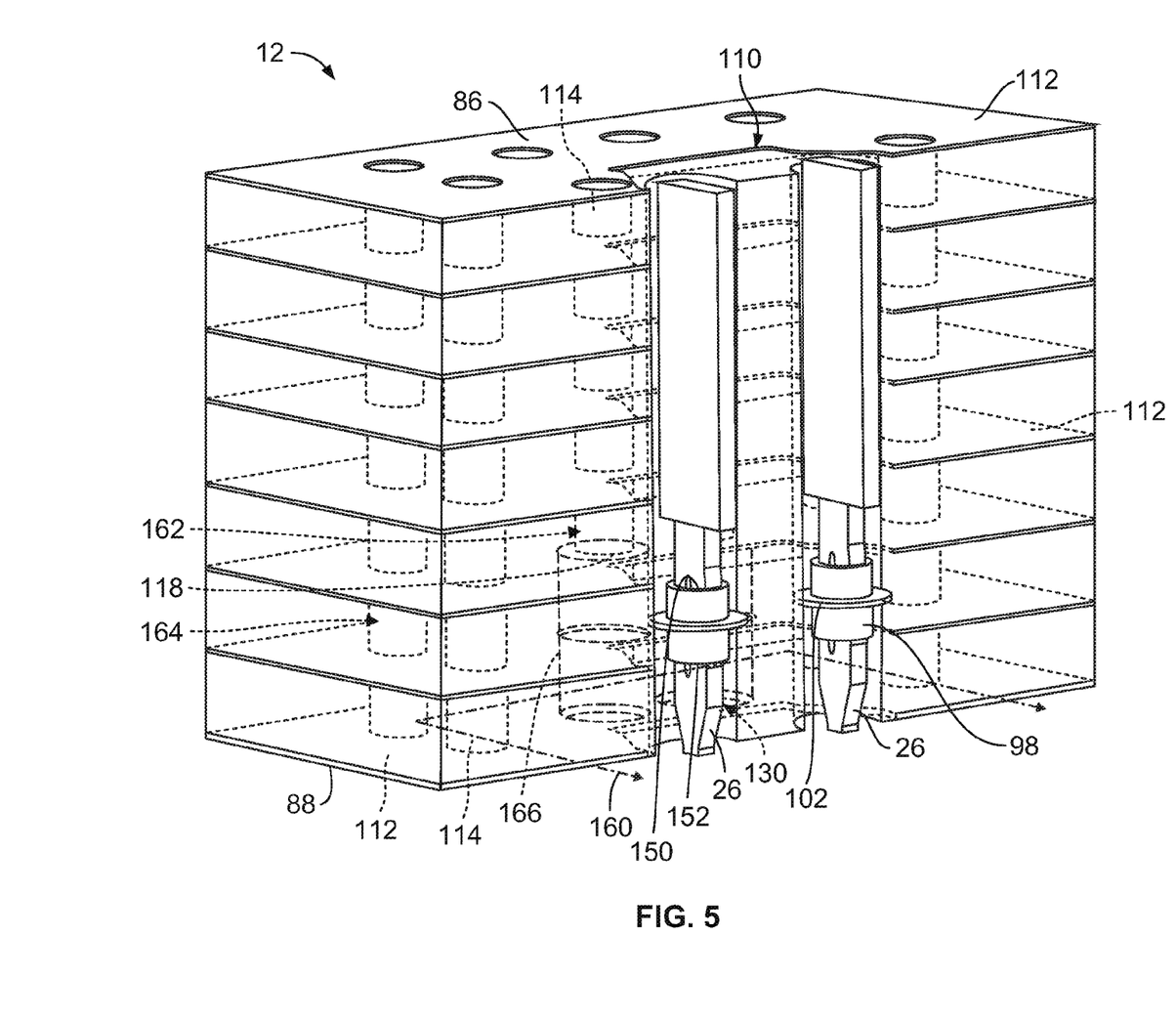
FIG. 5 is a partial cut-away view of the circuit board shown in FIG. 2 illustrating ground columns surrounding the signal terminals.

FIG. 4 is a side view of the circuit board 12 similar to the view shown in FIG. 3, but having the signal terminals 26 and ground terminals 28 mounted to the circuit board 12. The mounting contacts 30, 34 of the signal and ground terminals 26, 28, respectively, are the only portions of the signal and ground terminals 26, 28 illustrated in FIG. 4.

The mounting contacts 30, 34 form part of the lead frame 24 (shown in FIG. 1), and are formed integral with the signal and ground terminals 26, 28, respectively. In an exemplary embodiment, the lead frame 24 is stamped and formed to define the signal and ground terminals 26, 28. The mounting contacts 30, 34 are the portions of the signal and ground terminals 26, 28 extending from the mounting face 42 of the contact modules 22 (both shown in FIG. 1). The mounting contacts 30 are received within the signal vias 54. The mounting contacts 34 are received in the ground vias 56.

The mounting contacts 30 include a mounting portion 130 and a transition portion 132. The mounting portion 130 engages the electrical conductor 98, and is thus electrically connected to the mounting pad 102 within the corresponding via 54. In the illustrated embodiment, the mounting portion 130 is represented by an eye-of-the-needle contact. The length of the mounting portion 130 is slightly longer than the electrical conductor 98 to ensure electrical contact thereto.

The transition portion 132 extends between the mounting face 42 and the mounting portion 130. In the illustrated embodiment, the transition portion 132 and the mounting portion 130 are coplanar. However, in alternative embodiments, the transition portion 132 may be generally offset with respect to the mounting portion 130, such as described in U.S. patent application titled "ELECTRICAL CONNECTOR SYSTEM", the complete subject matter of which is incorporated by reference herein. The amount of offset is established to control the impedance of the signal terminals 26 and/or cross-talk between the signal terminals 26 and neighboring traces 104. The larger diameter portions 96 of the signal vias 54 provide space for the transition portions 132 to be offset from the via axes 106.

The mounting contacts 34 include a mounting portion 134 that engages the ground column 114, and is thus electrically connected to one or more ground layers 112 of the circuit board 12. In the illustrated embodiment, the mounting contacts 34 represent eye-of-the-needle contacts, however other types of contacts may be used in alternative embodiments. In the illustrated embodiment, because the mounting contact 30 is relatively long, and mates to a mounting pad 102 in one of the bottom layers of the circuit board 12, the mounting portion 134 is arranged above the mounting portion 130 of the mounting contact 30. The ground via 56 and the ground column 114 may be counterbored to the vicinity of the mounting portion 130 such that the column bottom 118 is above the electrical conductor 98.

FIG. 5 is a partial cut-away view of the circuit board 12 illustrating the ground columns 114 surrounding a pair of the signal terminals 26. The body of the circuit board 12 has been removed for clarity such that the ground columns 114, ground layers 112, mounting pads 102, electrical conductors 98 and signal terminals 26 are illustrated.

The mounting pad 102 is embedded within the circuit board 12 at a particular depth. The electrical conductors 98 are electrically connected thereto and extend along the via axis 106 (shown in FIG. 2) between an upper conductor rim 150 and a lower conductor rim 152. The upper conductor rim 150 is above the mounting pad 102 and the lower conductor rim 152 is below the mounting pad 102. The mounting portion 130 is received within the electrical conductor 98 and makes electrical contact thereto. In the illustrated embodiment, the mounting portion 130 is an eye-of-the-needle contact.

The ground layers 112 are embedded within the circuit board 12. Each of the ground layers 112 includes at least one opening 110 therethrough. The signal vias 54 (shown in FIG. 4) and signal terminals 26 pass through the corresponding openings 110 and are spaced apart from the openings 110. The ground vias 56 (shown in FIG. 4) pass through the ground layers 112 such that the ground columns 114 are electrically connected to each ground layer 112 through which the ground column 114 passes. For example, when the ground vias 56 are formed, the ground layers 112 are exposed. When the ground vias 56 are plated to form the ground columns 114, the ground columns 114 contact the ground layers 112, electrically commoning the ground columns 114 and the ground layers 112.

Figure 6:
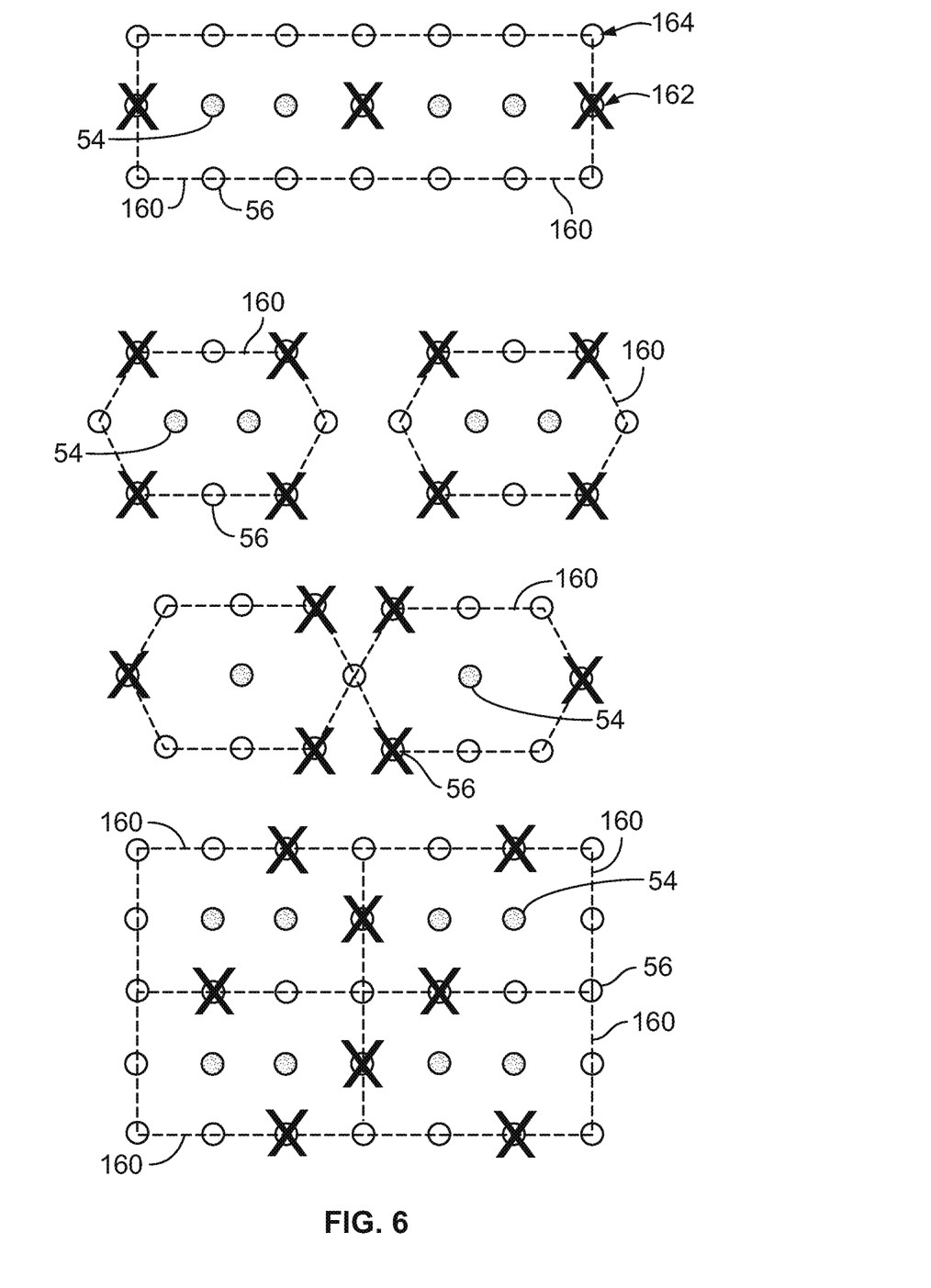
FIG. 6 is a schematic representation of exemplary patterns of signal vias and ground vias for the circuit board.

The ground columns 114 are arranged within the circuit board 12 in a pattern, generally surrounding the signal vias 54 and signal terminals 26. The ground columns 114 are spaced apart from one another, and generally form a ground ring 160, a portion of which is shown in FIG. 5, around the signal vias 54 and signal terminals 26. Examples of ground rings 160 are also illustrated in FIG. 6. The ground ring 160 may have any shape surrounding the signal vias 54 and signal terminals 26, such as a rectangular shape, an elliptical shape, a circular shape, an irregular shape, and the like. The ground ring 160 may surround any number of signal vias 54 and signal terminals 26, however, ground rings 160 will typically surround one or two signal vias 54 and signal terminals 26. For example, in the illustrated embodiment, the ground ring 160 surrounds a pair of signal vias and signal terminals 26 that carry differential pair signals. The ground ring 160 generally includes the nearest neighboring ground columns 114 of the corresponding signal terminals 26. The ground columns 114 are typically positioned between one set of signal terminals 26 and another set of signal terminals 26, and the ground columns 114 may form part of the ground rings 160 for both sets of signal terminals 26. In other words, each ground column 114 may form part of more than one ground ring 160.

In an exemplary embodiment, at least some of the ground columns 114 in each ground ring 160 are counterbored, or otherwise modified or formed, to have column bottoms 118 above the corresponding electrical conductor(s) 98 within the ground ring 160. For example, the ground columns 114 may be separated into a first subset 162 of the ground columns 114 extending to a first depth from the upper surface 86 and a second subset 164 of the ground columns 114 extending to a second depth from the upper surface 86 greater than the first depth. The column bottoms 118 in the first subset 162 of ground columns 114 are arranged at a depth above the upper conductor rim 150. The column bottoms 118 in the second subset 164 of ground columns 114 are arranged at a depth below the lower conductor rim 152. For example, the column bottoms 118 in the second subset 164 of ground columns 114 may be arranged at a depth at or below the first ground plane below the mounting pad 102. Optionally, the column bottoms 118 in the second subset 164 are arranged at the lower surface 88 of the circuit board 12.

When counterbored, portions of the ground columns 114, as well as portions of the ground layers 112 and material of the circuit board 12, are removed, creating a counterbore region 166 (shown in FIG. 1 and shown in phantom in FIG. 5). At least some of the ground columns 114 of the ground ring 160 remain and extend through the circuit board 12 along the electrical conductors 98. Such ground columns 114 remain to provide return current paths in the circuit board 12 at the depth of the electrical conductors 98. However, when numerous ground columns 114 surround the signal terminals 26, a select few of the ground columns 114 can be counterbored and removed to improve the impedance of the signal terminals 26, at least along the portion of the signal terminals 26 surrounded by the electrical conductors 98.

FIG. 6 is a schematic representation of exemplary circuit board footprints showing patterns of ground rings 160 of ground vias 56 surrounding signal vias 54. These patterns are merely illustrative, and many other configurations are possible in alternative embodiments. The ground vias 56 within the first subset 162 having portions of the ground columns 114 (shown in FIG. 5) therein removed, are marked with an X. The signal vias 54 are represented by filled-in circles. Additionally, the patterns merely show ground rings 160 around one or two sets of signal vias 54, and the total number and placement of signal and ground vias 54, 56 would depend on the particular electrical connector being mounted to the circuit board.

In an exemplary embodiment, the signal vias 54 are arranged in rows and/or columns to define the footprint. The signal vias 54 may, or may not, be aligned with each other in adjacent rows and columns. The ground vias 56 are interspersed among the signal vias 54. At least some, but not necessarily all, of the ground vias 56 may receive corresponding ground terminals 28 (shown in FIG. 1). Other ground vias 56 are merely routed through the circuit board and do not receive any ground terminals 28. In the illustrated embodiments, more ground vias 56 are provided than signal vias 54. The ground vias 56 surrounding the signal vias 54 define the ground rings 160.

The ground rings 160 may include any number of ground vias 56. The ground rings 160 typically include only the nearest ground vias 56, as those ground vias 56 have the greatest effect on the electrical characteristics of the signal via(s) 54 associated with the ground ring 160. Any number of signal vias 54 may be arranged within each ground ring 160. The shape of the ground ring 160 surrounding the signal vias 54 is defined by the positioning of the ground vias 56 with respect to the signal vias 54. Any number of the ground vias 56 may be within the first subset 162, and such ground vias 56 are selected to attempt to improve the electrical characteristics of the signals. For example, selecting more ground vias 56 to be in the first subset may improve the impedance, however, selecting too many ground vias 56 may negatively impact the electrical characteristics of the signals within that ground ring 160 or in an adjacent ground ring 160.

The embodiments described and/or illustrated herein provide an electrical connector that may enable improvement of the density and/or electrical performance of circuit board footprints to achieve higher system densities and/or higher system speeds. For example, the embodiments described and/or illustrated herein, when left at the same density as at least some known systems, may decrease via to via coupling and may increase circuit board footprint impedance. Alternatively, the embodiments described and/or illustrated herein may be able to achieve higher footprint densities than at least some known systems while maintaining the same via to via coupling and impedance levels of such known systems. The embodiments described and/or illustrated herein may provide improved electrical characteristics between signal terminals of the electrical connector.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A circuit board comprising:
a substrate having an upper surface and a lower surface;
signal vias extending at least partially through the substrate along signal via axes being configured to receive signal terminals, the signal terminals being arranged in pairs carrying differential pair signals, the signal vias being configured to receive the signal terminals of each pair such that the signal terminals extend to substantially the same depth within the signal vias; and
ground vias extending at least partially through the substrate along ground via axes being configured to receive ground terminals, the ground vias being arranged in a predetermined pattern around the signal vias to create a ground ring surrounding the corresponding signal via, wherein the ground vias of the ground ring surrounding both signal vias that receive the signal terminals carrying the differential pair signals, wherein the ground vias are at least partially filled with a conductive material to create a ground column, each ground column extending from a column top to a column bottom, a first subset of the ground columns extending to a first depth and a second subset of the ground columns extending to a second depth greater than the first depth.

2. The circuit board of claim 1, wherein the signal vias have electrical conductors on inner surfaces thereof being electrically connected to corresponding signal traces, the signal vias being configured to receive signal terminals such that the signal terminals engage the electrical conductors, the first subset of ground columns in the ground ring having the column bottoms at a depth above the electrical conductor of the corresponding signal via.

3. The circuit board of claim 1, wherein the signal vias have electrical conductors on inner surfaces thereof being electrically connected to corresponding signal traces, the electrical conductors having an upper conductor rim and a lower conductor rim, the column bottoms in the first subset of ground columns being arranged at a depth above the upper conductor rim, the column bottoms in the second subset of ground columns being arranged at a depth below the signal traces associated with the electrical conductors.

4. The circuit board of claim 1, wherein the first subset of ground columns includes less ground columns than the second subset of ground columns.

5. The circuit board of claim 1, wherein the column bottoms of the first subset of ground columns are formed by counterboring away a portion of the ground column from the lower surface of the circuit board.

6. The circuit board of claim 1, wherein the substrate includes a plurality of ground layers, each ground layer having at least one opening therethrough, each signal via passing through a corresponding opening and being spaced apart from the ground layer, the ground columns passing through one or more ground layers and being electrically connected to the ground layers such that the ground columns and the ground layers are at the same electrical potential.

7. The circuit board of claim 1, wherein the substrate includes a plurality of mounting pads, the signal vias passing through corresponding mounting pads, the signal vias having a smaller diameter portion and a larger diameter portion, the smaller diameter portion being plated to define an electrical conductor electrically connected to the corresponding mounting pad, the electrical conductors being configured to be electrically connected to corresponding signal terminals, the larger diameter portion being counterbored from either the upper surface or the lower surface.

8. A circuit board comprising:
a substrate having an upper surface and a lower surface;
signal traces routed through the substrate;
signal vias extending at least partially through the substrate along via axes, the signal vias having electrical conductors on inner surfaces thereof being electrically connected to corresponding signal traces, the signal vias being configured to receive signal terminals such that the signal terminals engage the electrical conductors; and
ground vias extending at least partially through the circuit board along via axes, the ground vias being plated with a plating material, the ground vias being arranged in a predetermined pattern around the signal vias to create a ground ring surrounding the corresponding signal via, wherein at least some of the ground vias in the ground ring are counterbored from the lower surface of the circuit board to remove at least a portion of the plating material to a depth above the electrical conductor of the corresponding signal via.

9. The circuit board of claim 8, wherein the plating material of the ground vias defines a ground column, each ground column extending from a column top to a column bottom, the depth of the column bottom being defined by the amount of counterboring from the lower surface of the circuit board.

10. The circuit board of claim 8, wherein the plating material of the ground vias defines a ground column, each ground column extending from a column top to a column bottom, the ground contacts that are counterbored define a first subset of ground columns, the ground contacts that are not counterbored define a second subset of ground columns, the first subset of ground columns extends to a first depth from the upper surface and the second subset of the ground columns extends to a second depth from the upper surface greater than the first depth.

11. The circuit board of claim 8, wherein the plating material of the ground vias defines a ground column, each ground column extending from a column top to a column bottom, the ground contacts that are counterbored define a first subset of ground columns, the ground contacts that are not counterbored define a second subset of ground columns, the first subset of ground columns have the column bottoms at a depth above the electrical conductor of the corresponding signal via.

12. The circuit board of claim 8, wherein the plating material of the ground vias defines a ground column, each ground column extending from a column top to a column bottom, the ground contacts that are counterbored define a first subset of ground columns, the ground contacts that are not counterbored define a second subset of ground columns, and wherein the electrical conductors have an upper conductor rim and a lower conductor rim, the column bottoms in the first subset of ground columns being arranged at a depth above the upper conductor rim, the column bottoms in the second subset of ground columns being arranged at a depth below the signal traces associated with the electrical conductors.

13. The circuit board of claim 8, wherein the circuit board includes a plurality of mounting pads, the signal vias passing through corresponding mounting pads, the signal vias having a smaller diameter portion and a larger diameter portion, the smaller diameter portion being plated to define the corresponding electrical conductor, the electrical conductors being electrically connected to the corresponding mounting pad and being configured to be electrically connected to corresponding signal terminals, the larger diameter portion being counterbored from at least one of the upper surface or the lower surface.

14. An electrical connector assembly comprising:
an electrical connector having a mounting face and ground terminals extending from the mounting face, the electrical connector having variable depth signal terminals configured to extend different lengths from the mounting face; and
a multi-layer circuit board having an upper surface and a lower surface, the circuit board comprising:
signal traces routed through the circuit board;
ground layers positioned within the circuit board;
a first signal via and a second signal via extending at least partially through the circuit board along parallel via axes, the first and second signal vias having electrical conductors on inner surfaces thereof being electrically connected to corresponding signal traces, the signal vias being configured to receive signal terminals such that the signal terminals engage the electrical conductors, the signal terminals being configured to extend different depths into the corresponding signal vias based on the lengths of the signal terminals; and
ground vias extending at least partially through the circuit board along parallel via axes, the ground vias passing through at least one of the ground layers, the ground vias being plated with a plating material being electrically connected to at least one of the ground layers, the ground vias being arranged in a predetermined pattern around the first signal via to create a ground ring surrounding the first signal via, wherein the ground vias are at least partially filled with a conductive material to create a ground column, each ground column extending from a column top to a column bottom, a first subset of the ground columns extending to a first depth being above the electrical conductor of the corresponding signal via, a second subset of the ground columns extending to a second depth greater than the first depth.

15. The assembly of claim 14, wherein the signal terminals are arranged as differential pairs, the first and second vias receiving signal terminals of the same differential pair, both the first and second signal vias are arranged within the ground ring.

16. The assembly of claim 14, wherein the ground columns are formed by plating the ground vias with plating material, the plating material of the first subset of ground columns being counterbored from the lower surface of the circuit board to remove at least a portion of the plating material to a depth above the electrical conductor of the corresponding signal via.

17. The assembly of claim 14, wherein the electrical conductors have an upper conductor rim and a lower conductor rim, the column bottoms in the first subset of ground columns being arranged at a depth above the upper conductor rim, the column bottoms in the second subset of ground columns being arranged at a depth below the lower conductor rim.

18. The assembly of claim 15, wherein the circuit board includes a plurality of mounting pads, the signal vias passing through corresponding mounting pads, the signal vias having a smaller diameter portion and a larger diameter portion, the smaller diameter portion being plated to define an electrical conductor electrically connected to the corresponding mounting pad, the signal terminals engaging the electrical conductor, the larger diameter portion being counterbored from either the upper surface or the lower surface.

19. The assembly of claim 15, wherein each ground layer has an opening therethrough, the first signal via passing through at least one of the openings in the ground layers, the ground columns passing through one or more ground layers and being electrically connected to the ground layers such that the ground columns and the ground layers are at the same electrical potential.

* * * * *